United States Patent [19]

Lindsay

[11] Patent Number: 4,701,350

[45] Date of Patent: Oct. 20, 1987

[54] PROCESS FOR ELECTROLESS METAL DEPOSITION

[75] Inventor: Deborah J. Lindsay, Princeton, N.J.

[73] Assignee: Surface Technology, Inc., Princeton, N.J.

[21] Appl. No.: 899,095

[22] Filed: Aug. 22, 1986

Related U.S. Application Data

[60] Division of Ser. No. 578,829, Feb. 10, 1984, which is a continuation of Ser. No. 310,785, Oct. 13, 1981, abandoned, which is a continuation-in-part of Ser. No. 204,495, Nov. 6, 1980, abandoned.

[51] Int. Cl.$^4$ .............................................. B44D 1/14
[52] U.S. Cl. ...................................... 427/97; 427/98; 427/304; 427/305; 427/306
[58] Field of Search ............................... 427/304–306, 427/97, 98

[56] References Cited

U.S. PATENT DOCUMENTS

| | | | |
|---|---|---|---|
| 3,175,964 | 3/1965 | Watanabe | 204/37 |
| 3,421,922 | 1/1969 | Wilson | 427/129 |
| 3,563,784 | 2/1971 | Innes | 117/47 |
| 3,702,285 | 11/1972 | Knorre | 204/30 |
| 3,899,617 | 8/1975 | Courdueelis | 427/304 |
| 4,077,853 | 3/1978 | Coll et al. | 204/20 |
| 4,089,993 | 5/1978 | Shirahata | 427/128 |
| 4,217,182 | 8/1980 | Cross | 204/15 |
| 4,244,789 | 1/1981 | Coll et al. | 204/20 |

*Primary Examiner*—Sam Silverberg

[57] ABSTRACT

Disclosed herein are processes for the electroless (chemical) plating of substrates incorporating polyelectrolytes to increase the catalytic site density prior to the electroless (chemical) metal deposition step.

26 Claims, No Drawings

PROCESS FOR ELECTROLESS METAL DEPOSITION

Reference to prior application: This application is a divisional application of copending application Ser. No. 578,829 filed Feb. 10, 1984 now U.S. Pat. No. 4,634,619 which is a continuation of application Ser. No. 310,785 filed Oct. 13, 1981, now abandoned, which is a continuation-in-part of application Ser. No. 204,495 filed Nov. 6, 1980 now abandoned.

BACKGROUND OF THE INVENTION

Electroless or chemical or autocatalytic or chemical coating of dielectric (non-conductor) substrates or composite printed circuitry substrates are well known processes finding wide utility in the preparation of such diverse articles as printed circuitry arrays (e.g., PTH), automotive trim, decorative plating, mirrors, decorative silver spray and the like. Normal electroless coating processes generally involve an initial cleaning and/or etching of the substrate by physical or chemical means so as to improve the adherence of the metallic coating. In addition, the etched substrate generally provides with improved wettability toward water. The etched surface is then catalyzed or sensitized by suitable catalytic composition and processes to provide a surface capable of electroless (chemical) plating initiation.

In the prior art the catalytic treatment generally encompassed the use of precious metals (e.g., palladium). More recently, compositions and processes utilizing non-precious metals have been disclosed suitable for electroless plating of dielectrics. The following U.S. patents disclose the prior art as applied to non-precious metals as well as precious metal catalysts for electroless or chemical plating processes. These patents are included herein by reference. U.S. Pat. Nos. 3,993,491; 3,993,799; 3,993,801; 3,993,848; 3,958,048; 4,048,354; 4,082,899; 4,087,586; 4,131,699; 4,123,832; 4,136,216; 4,150,171; 4,151,311; 4,167,596; 4,180,600; 4,181,759; 4,181,760; 4,220,678; 4,224,178; 3,011,920. Also British Pat. No. 1,426,462 is included by reference. The following applications also reflect the state of the art and they are included herein by reference: Ser. No. 052,857 now U.S. Pat. No. 4,278,712; 061,484 now U.S. Pat. No. 4,301,190; 106,916 now U.S. Pat. No. 4,284,666; and 144,428 now U.S. Pat. No. 4,297,397. U.S. Pat. No. 3,657,003 hydrous oxide sols have been utilized as a preliminary step or method for rendering nonwettable (hydrophobic) surfaces wettable. In U.S. Pat. No. 3,563,784 a preactivation of synthetic resin has been described. The preactivation step encompasses the use of surfactant solutions. The novelty relates to a composition in which the surfactants are selected from derivatives of acid phosphate esters. In U.S. Pat. No. 3,563,784 the inventor contends that the use of the preferred surfactant composition stems from the resulting decreased surface tension at the substrate interface. In application Ser. No. 061,484 now U.S. Pat. No. 4,301,190 the use of hydrous oxides, surfactants, and complexing agents are disclosed for usage prior to colloidal non-precious metal catalysts. The prior art has suggested that both positively and negatively charged colloid could be used in the rendering of substrates catalytic for chemical plating.

In U.S. Pat. No. 3,993,848 the use of phenol and derivatives thereof, including miscellaneous aromatics, have been shown as linking agents for Sn/Cu type catalysts. Unfortunately these materials are relatively expensive, requiring large concentrations, and they further impose a major problem in their waste disposal and health hazards. Another limitation encountered is due to excess concentration of these materials (e.g., phenol); it appears to cause a permanent distortion onto the non-conductor substrate (e.g., ABS). In U.S. Pat. No. 3,993,848 the linking agents used are found to be compatible with the Sn/Cu composition, and they appear to increase the adsorption of $Sn^{+2}$ ions. Regardless, however, none of the materials disclosed in the above prior art disclose the use of high polymeric polyelectrolytes or flocculants or coagulants.

In some of the references disclosed above, particularly in the electroless plating for printed circuitry (e.g., PTH processing), there appears to be a change in surface charge especially after certain of the etching steps (e.g., ammonium persulfate). Such modification in a surface charge may adversely affect the adsorption and/or absorption of the catalyst (or sensitizer) onto the dielectric substrate or any other substrate and consequently affect its ability for electroless (chemical) plating initiation and as well as the resulting uniformity of plating. Incomplete electroless plating can often lead to skip plating. Such consequences cannot be afforded in many commercial practices. Accordingly, it is highly desirable to provide with a manner by which a simple and inexpensive modification may be adapted compatible with the process and material, thereby insuring increased adsorption of components which lead to the catalytic sites.

At the same time, it is imperative that any new substances employed be inexpensive, compatible with waste-disposal treatment(s) now employed, and not introduce any potential health-hazard problems.

SUMMARY OF THE INVENTION

It is the principle object of the present invention to provide an effective and economical process(es) for the preparation of substrate(s) for electroless (or chemical) plating. In its particular application, the particular object of the present invention is to provide means for increased adsorbed catalytic site density needed for effective and reliable metallization through the incorporation of a treating composition comprising polyelectrolyte(s).

DETAILED DESCRIPTION OF THE INVENTION

The process of the present invention is applicable to metallic plating on a wide variety of dielectric (non-conductor) substrates, composites comprising non-conductors and metals, as well as semiconductors and metals. Normally, substrates to be plated will be cleaned and/or etched prior to plating in order to improve the adherence of the metallic coating and decrease the hydrophobic nature of the substrate. The present invention is an improvement to the processes disclosed above (references on pages 2 and 3, and which are included herein by reference). It is believed that the use of a new class of adsorption modifier, i.e., polyelectrolyte, changes the net charge of the surface and/or provides chemical bonds for the subsequent adsorption (or absorption) of the active catalytic (or sensitizer) composition. Though the use of the polyelectrolyte may be included within the catalytic composition, it is preferable to use such modifier as a pretreatment step so as to insure the maintenance of the catalytic composition unaltered, particularly whenever such compositions are of a colloidal nature. Cross contamination leads to a change in stability and hence reactivity of the catalytic (or sensitizer) composition.

In general, the electroless or chemical coating process of the present invention comprises the following preferred sequence, with suitable rinsing between key steps.

1. Cleaning and/or etching of the substrate, with preferred rinsing thereafter in a suitable medium.
2. Contacting the substrate with a composition comprising the adsorption modifier, i.e., a polyelectrolyte, thereby providing improved adsorption and/or absorption of the catalytic (or sensitizer) composition thereafter.
3. Contacting the treated substrate with a catalytic composition, preferably colloids of non-precious catalytic metals and preferably selected from the group consisting of copper, nickel, cobalt and iron and mixtures thereof. The catalytic metal may be in any of several oxidation states or forms: elemental state, part of an alloy, compounds, or soluble complexes.
4. Immersion of the treated substrate into a compatible electroless (or chemical or spray deposition) plating bath for the desired metallic build-up.

It is noted that at times it may also be preferable to interpose an intermediate step prior to the electroless metal deposition and after the contacting of the substrate with the catalytic composition. Such step may be referred to as activation or acceleration, as has been noted in the patents and articles referred to above. The use of an activator composition may be necessitated either for reducing the induction time in the electroless step and/or for removing weakly adsorbed catalytic component to insure a reliable process and improved overall metal adhesion.

The term "adsorption modifier" or "absorption modifier" as used herein refers to a new class of substances, i.e, polyelectrolytes. Polyelectrolytes are generally high polymeric substances (either natural or synthetic) containing ionic constituents. They may be cationic or anionic. Major commercial uses of polyelectrolytes are flocculation of solids, dispersion of clays in well drilling muds, soil conditions and waste treatment. Polyelectrolytes are also referred to at times as flocculants or coagulants. The concentration range for employing the present polyelectrolytes is broad, as is their temperature of operation. It is thus understood that the term polyelectrolyte encompasses flocculants and/or coagulants. These materials are relatively inexpensive, and are used in waste-treatment procedures.

The following examples are illustrative of the present invention and are not to be taken in limitation thereof.

Though the present invention is primarily aimed at the metallization of non-conductor substrates, it is recognized that adaptation of the present process and composition may be applicable to metallic and semiconductor substrates as well. Accordingly, the extension of the present examples onto non-conductor, metallic, and semiconductor type substrates falls within the spirit of this invention. Accordingly, the use of the term "substrate" encompasses metals, semiconductors, nonconductors, and combinations thereof.

EXAMPLE 1

An ABS substrate was etched in a composition comprised of chromium trioxide, sulfuric acid, and a fluorocarbon surfactant (FC-95), all dissolved in water. The composition employed for the etched substrate is typical of those used in the art and published in a great variety of references including those above. After being etched, the substrate was rinsed and immersed into a composition comprising an adsorption modifier for approximately 3 minutes at room temperature. The composition was comprised of:

| | |
|---|---|
| Daxad CP-1, (40% active) product of W. R. Grace | 2.5 ml |
| 6 normal sodium hydroxide | 5 ml |
| Total volume adjusted with water to | 100 ml |
| Final pH | approx. 11 |

The substrate was then rinsed and thereafter contacted with a colloidal catalytic composition for 3 minutes. The activated substrate was rinsed and thereafter contacted by immersion in an electroless copper plating composition operating at 47° C. for about 3 minutes. The electroless copper composition chosen is a typical commercial bath, e.g., CP-74 sold by the Shipley Company, Newton, Mass. The colloidal composition used was derived from a concentrate composition which was the admixture of the following chemicals and reactants. The colloid (control) was selected for conditions to give little plating in order to emphasize the concept of the present invention.

| | |
|---|---|
| 2 molar cupric chloride | 20 ml |
| 2.7 molar stannous fluoroborate | 18.75 ml |
| 100 g/l gelatin | 100 ml |
| water | 650 ml |
| 0.263 molar sodium borohydride in 2.64 normal sodium hydroxide | 95.5 ml |
| pH adjusted to 8.0 after the colloid nucleation | |

This composition was mixed at above room temperature (e.g., 78° C.) in accordance to the findings disclosed in U.S. Pat. No. 4,265,942. Working composition was made from the above concentrate by dilution of approximately 30 ml of concentrate stock composition in 120 ml of DI water.

From the results of Example 1, 100% metallic coverage of the substrate was noted when using the above modifier or polyelectrolyte. However, elimination of the modifier provided with incomplete coverage.

It is interesting to note that the combination of the colloid of Example 1 with 1% active Daxad CP-1 separated after about 1½ days. By contrast, the same colloidal composition without the Daxad CP-1 additive did not separate. Accordingly, it is preferred to use the present polyelectrolytes as a preliminary step prior to the catalytic composition, especially whenever the latter is a colloidal dispersion. In fact, some of the polyelectrolytes of this invention are used to precipitate colloids from wastes or dispersions.

EXAMPLE 2

A glass slide was cleaned in oakite at 50° C. After rinsing, the cleaned slide was immersed in 2½% Daxad CP-1 (pH 11) solution for 3 minutes. The slide was then immersed in a colloidal dispersion (same composition as described in Example 1) for 3 minutes. The activated slide was rinsed and immersed in copper electroless bath CP-74, at 47° C. for 3 minutes. After removal of the slide, 100% coverage was noted on both sides. This procedure was repeated without the Daxad CP-1 step, and no plating was noted.

EXAMPLE 3

A silicon wafer, P type Si [III], 1.44–2.16Ω cm$^{-1}$ was cleaned in oakite at 50° C. After rinsing, the wafer was immersed in a 2½% solution of Daxad CP-1 with sodium hydroxide at pH 11 for 3 minutes. After rinsing, the wafer was immersed into a colloidal dispersion (same composition as described in Example 1) for 3 minutes and placed thereafter in a copper electroless bath, CP-74, at 47° C. for 3 minutes. On removal of the silicon wafer, significant plating was noted on both sides of the wafer. However, repeating the above procedure without the prewet step resulted in no plating.

EXAMPLE 4

An epoxy copper laminate with 12 through-holes was cleaned and placed in an etching solution of ammonium persulfate (120 g/l) for 3 minutes with agitation and rinsed thereafter. The etched epoxy laminate was then immersed in a 2½% Daxad CP-1 solution at pH 11 for 3 minutes with agitation. After rinsing, it was immersed in a colloidal dispersion (same composition as described in Example 1) for 3 minutes with mild agitation. The activated epoxy laminate was placed in an electroless copper bath CP-74 at 47° C. for 10 minutes with agitation. After rinsing and drying, examination of the section of epoxy laminate showed that all through-holes were plated 100% with no breaks or skips. By contrast, repeating the above procedure without the pretreatment step did not yield 100% coverage.

EXAMPLES 5–11

In the following examples the basic procedure was the same as described in Example 1, however the pretreatment composition was modified to include other cationic polyelectrolytes, many of which are commercial flocculants or coagulants. In all cases the control (in the absence of the modifier) provided incomplete coverage, whereas, as shown in the Table below, the inclusion of the modifier resulted in 100% coverage with the exception of one of the examples (#8) which only provided about 75%.

| Example | Prewet & % activity | | Chemical Make-up | pH | Plating Results |
|---|---|---|---|---|---|
| 5 | Sandolec$^{(a)}$ CF | .83 | Cationic polyamideamine | at prep pH | 100% |
| 6 | Sandolec CS | 2.5 | Cationic alkylene guanidine | 11 | 100% |
| 7 | Sandolec CT | 1.25 | Cationic polyamine | 11 | 100% |
| 8 | Sandolec CW | 1.25 | Cationic methylene guanidine | 11 | 75% |
| 9 | Sandolec CL | 1.25 | Cationic polyimidazoline | 11 | 100% |
| 10 | Cat-Floc$^{(b)}$ | 2.5% of stock | — | 11 | 100% |
| 11 | Cat-Floc T | 2.0% of stock | — | 11 | 100% |

$^{(a)}$The Sandolec products are supplied by Sandoz, Inc. East Hanover, NJ
$^{(b)}$The Cat-Floc products are supplied by Calgon Corp., Pittsburgh, PA

EXAMPLE 12

The process according to Example 1 was repeated. However, Lufax 295 was used at 1.25% for the cationic polyelectrolyte. The cationic composition was used at extreme pH values of 2 and 11. In both cases 100% plating results were noted. Lufax 295 is a product of Rohm & Haas Company.

EXAMPLE 13

An etched ABS substrate was immersed in a colloidal catalytic composition (as in Example 1) to which was added 0.1 ml active Sandolec CF for 3 minutes. After rinsing and immersion in copper electroless bath CP-74 for 10 minutes, a 60% coverage was observed. No coverage was observed when this was repeated without the added cationic polyelectrolyte. Though some improvement has been noted, this mode is not practical. Specifically, due to the inherent charge of the polyelectrolytes, there will be charge modification for the catalytic composition. Such charge is particularly dangerous for colloidal systems, leading to the eventual precipitation of the colloids. In fact, some of the polyelectrolytes are used for the purpose of settling solid wastes including colloids from solutions.

From the above examples it should be obvious to use polyelectrolytes (cationic or anionic types) as prewet prior to the activation (catalysis) of substrates in electroless plating. The determination of which type of polyelectrolyte should be used can be ascertained by simple experimentation. Furthermore, for the catalytic composition colloids of precious metals and true solution catalysts may be used, and hence their adaptation falls within the spirit of this invention. It is also noted that the polyelectrolytes used herein are materials which are used as flocculants.

It is interesting to note that, in some cases, the effectiveness of the polyelectrolytes in the present invention was found to be unrelated to the manufacturer's designation. Specifically, in certain instances weakly charged polyelectrolytes were found to be more effective in comparison to strongly charged polyelectrolytes.

Though the majority of the above examples are related to non-precious metal catalysts, it has also been observed that polyelectrolytes are useful in the prior art catalyst, i.e., those bearing precious metals (e.g., palladium). The adaptation of polyelectrolytes to precious metal catalysts and its improvements should be evident from the following examples. As test vehicles ABS substrates were evaluated after suitable preparation as in Example 1.

It should also be noted that a specific polyelectrolyte suitable for one catalytic composition may not be best for another composition. Accordingly, simple testing can be made for the best polyelectrolyte for a specific catalytic composition (e.g., precious metal colloids vs. non-precious metal or the same catalytic metal with different colloid stabilizer(s)).

EXAMPLE 14

A palladium catalyst was prepared as follows:

| | |
|---|---|
| DI water | 940 ml |
| Conc. HCl | 40 ml |
| Catalyst 9F (product of the Shipley Co., Newton, MA) | 20 ml |

The cleaned and etched ABS substrates were immersed into an anionic polyelectrolyte (Sandolec AP) at pH 2 and 1.5% for about 3 minutes, and rinsed prior to the catalyst. After the catalyst immersion and plating, 100% metallic coverage was noted in an electroless copper CP-74; however, deletion of the polyelectrolyte from the process only resulted in 20% metallic coverage for the same conditions and composition.

EXAMPLE 15

In this example a cationic polyelectrolyte was used (Sandolec CF at pH 9) similar to the process of Example 14. At the conclusion of the sequence 100% metallic coverage was noted.

From the above examples and teachings it should be recognized that the polyelectrolytes may be used over a wide range of concentration, and moreover that usage is not limited to room temperature. In fact, at times a mild heating may be of assistance. Furthermore, it should be recognized that though the examples were primarily aimed at electroless, or autocatalytic, or chemical deposition, the present invention is applicable to chemical plating such as is used in the manufacture of mirrors by spray deposition. Typical metals which are used in spray deposition techniques are silver, nickel, and copper. In the spray technique generally a metal salt interreacts, at close proximity to the substrate, with a reducing agent thereby precipitating a reduced metal onto the substrate. In such applications it is also essential to provide a path or an adsorption modifier whereby the reduced metal would be adherent onto the substrates and yield the greatest possible number of metallic sites for subsequent deposition.

Moreover, as demonstrated above, this invention is applicable to a wide variety of catalytic metals, including precious and non-precious metals. In the use of precious metals conventional prior art compositions containing palladium, such as tin-palladium, have been found to be adaptable to the present adsorption modifier.

From the above examples and definitions it will be obvious that any of a wide variety of organic polyelectrolytes available commercially, also designated as flocculants or coagulants, may be utilized.

What I claim is:

1. A process for the metallization of a substrate by electroless plating or chemical plating comprising:
    a. contacting said substrate with a composition comprising and adsorption modifier, said modifier being a polyelectrolyte, thereby providing a path for the increased catalytic site density,
    b. rinsing said substrate to remove excess adsorption modifier, and thereafter without the use of a sensitizing step
    c. contacting said treated substrate with a noble catalytic metal composition, comprising a noble catalytic metal capable of electroless plating initiation, which directly or serving as a precursor leads to the catalytic sites which are capable of electroless plating initiation and wherein said noble catalytic metal may be either in the elemental state, an alloy, a compound, or a soluble complex, and mixtures thereof, and
    d. contacting said substrate with a compatible electroless plating bath to deposit a metallic layer.

2. The process according to claim 1 wherein said catalytic metal is palladium.

3. The process according to claim 1 wherein said catalytic metal is part of a colloidal product.

4. The process according to claim 1 wherein said substrate is ABS.

5. The process according to claim 1 wherein said electroless plating bath is chemical plating.

6. The process according to claim 1 wherein said substrate is glass.

7. The process according to claim 1 wherein said substrate is a semiconductor type material.

8. The process according to claim 1 wherein said electroless plating is of copper.

9. The process according to claim 1 wherein said polyelectrolyte is a cationic flocculant.

10. The process according to claim 1 wherein said catalytic metal is palladium and wherein said polyelectrolyte is a cationic type.

11. The process according to claim 1 wherein said catalytic metal is palladium and wherein said polyelectrolyte is a non-ionic type.

12. The process according to claim 1 wherein said polyelectrolyte is an anionic type.

13. The process according to claim 1 wherein said adsorption modifier is used above room temperature.

14. The process according to claim 1 wherein said adsorption modifier is used in the concentration range of 0.05% to 15%.

15. The process according to claim 1 wherein said catalytic metal is part of a soluble complex.

16. A process for the metallic of a printed circuitry substrate by electroless plating or chemical plating comprising:
    a. contacting said substrate with a composition comprising a polyelectrolyte, thereby providing a path for the increasing catalytic site density,
    b. rinsing said substrate to remove excess adsorption modifier, and thereafter without the use of a sensitizing step
    c. contacting said treated substrate with a noble catalytic metal composition, said composition comprising a noble metal capable of electroless plating initiation, which directly or serving as a precursor leads to the catalytic sites which are capable of electroless plating initiation and wherein said noble catalytic metal may be either in the elemental state, an alloy, compound, or soluble complex, and mixtures thereof, and
    d. contacting said substrate with a compatible electroless plating bath deposit a metallic layer.

17. The process according to claim 16 wherein said noble metal is palladium.

18. The process according to claim 16 wherein said noble metal is part of the colloidal product.

19. The process according to claim 16 wherein said printed circuitry substrate further contains throughholes.

20. The process according to claim 16 wherein said precious metal is part of a soluble complex.

21. The process according to claim 16 wherein said electroless plating bath is copper.

22. The process according to claim 16 wherein said polyelectrolyte is a cationic flocculant.

23. The process according to claim 16 wherein said polyelectrolyte is cationic.

24. The process according to claim 16 wherein said polyelectrolyte is anionic.

25. The process according to claim 16 wherein said polyelectrolyte is an anionic flocculant.

26. The process according to claim 16 wherein said polyelectrolyte is a coagulant.

* * * * *

REEXAMINATION CERTIFICATE (2417th)

United States Patent [19]

Lindsay

[11] B1 4,701,350

[45] Certificate Issued Nov. 1, 1994

[54] PROCESS FOR ELECTROLESS METAL DEPOSITION

[75] Inventor: Deborah J. Lindsay, Princeton, N.J.

[73] Assignee: Surface Technology Inc., Princeton, N.J.

Reexamination Request:
No. 90/003,192, Sep. 13, 1993

Reexamination Certificate for:
Patent No.: 4,701,350
Issued: Oct. 20, 1987
Appl. No.: 899,095
Filed: Aug. 22, 1986

Related U.S. Application Data

[60] Division of Ser. No. 578,829, Feb. 10, 1984, U.S. Pat. No. 4,634,619, which is a continuation of Ser. No. 310,785, Oct. 13, 1981, abandoned, which is a continuation-in-part of Ser. No. 204,495, Nov. 6, 1980, abandoned.

[51] Int. Cl.$^5$ ............................................. B44D 1/14
[52] U.S. Cl. ........................................ 427/97; 427/98; 427/304; 427/305; 427/306

[56] References Cited

U.S. PATENT DOCUMENTS 3,515,649  6/1970  Hepfer ................................. 205/164
3,567,532  3/1971  Jezi ..................................... 156/668

FOREIGN PATENT DOCUMENTS 956850  10/1974  Canada .
49-10275  1/1974  Japan .

*Primary Examiner*—Sam Silverberg

[57] ABSTRACT

Disclosed herein are processes for the electroless (chemical) plating of substrates incorporating polyelectrolytes to increase the catalytic site density prior to the electroless (chemical) metal deposition step.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-26 is confirmed.

* * * * *

REEXAMINATION CERTIFICATE (3287th)

United States Patent [19]

Lindsay

[11] B2 4,701,350

[45] Certificate Issued Aug. 5, 1997

[54] PROCESS FOR ELECTROLESS METAL DEPOSITION

[75] Inventor: Deborah J. Lindsay, Princeton, N.J.

[73] Assignee: Surface Technology, Inc., Princeton, N.J.

Reexamination Request:
No. 90/004,278, Jun. 17, 1996

Reexamination Certificate for:
Patent No.: 4,701,350
Issued: Oct. 20, 1987
Appl. No.: 899,095
Filed: Aug. 22, 1986

Reexamination Certificate B1 4,701,350 issued Nov. 1, 1994

Related U.S. Application Data

[62] Division of Ser. No. 578,829, Feb. 10, 1984, Pat. No. 4,634,619, which is a continuation of Ser. No. 310,785, Oct. 13, 1981, abandoned, which is a continuation-in-part of Ser. No. 204,495, Nov. 6, 1980, abandoned.

[51] Int. Cl.$^6$ ............................................. B44D 1/14
[52] U.S. Cl. ............................ 427/97; 427/98; 427/304; 427/305; 427/306

[56] References Cited

U.S. PATENT DOCUMENTS

| | | |
|---|---|---|
| 2,163,807 | 6/1939 | Piggott et al. . |
| 3,011,920 | 12/1961 | Shipley, Jr. . |
| 3,345,841 | 10/1967 | Phelan et al. . |
| 3,377,274 | 4/1968 | Burke et al. . |
| 3,421,922 | 1/1969 | Wilson . |
| 3,929,697 | 12/1975 | Morrill et al. . |
| 3,994,804 | 11/1976 | Rausch et al. . |
| 4,179,369 | 12/1979 | Bradley et al. . |
| 4,292,176 | 9/1981 | Grutsch et al. . |
| 4,895,620 | 1/1990 | Ko et al. . |
| 5,122,577 | 6/1992 | Noda . |

FOREIGN PATENT DOCUMENTS 956850 10/1974 Canada .

OTHER PUBLICATIONS

Hawley's Condensed Chemical Dictionary, Eleventh Edition, revised by N. Irving Sax and Richard J. Lewis, Sr., published by Van Nostrand Reinhold Co., New York, N.Y. (1987) at p. 934.

Organic Chemistry, 2nd Ed., by Robert Thornton Morrison and Robert Neilson Boyd, published by Allyn and Bacon, Inc., Boston, MA. (1966) at pp. 92, 109 and rear cover.

Fundamentals of Organic Chemistry by C.. Gutsche and D.J. Pasto, Prentice–Hall, Inc., Englewood Cliffs, N.J. (1975) at p. 44.

CRC Standard Mathematical Tables and Formulae, 29th Ed., W. H. Beyer, Ph.D., CRC Press, Boca Raton, FL. (1991) at pp. 115 and 137.

"Surface Active Agents their Chemistry and Technology," by A. M. Schwartz, and J.W. Perry, Interscience Publishers, New York, N.Y. (1940) at p. 173.

Hoover, et al., "Recent Advances In Ionic–Containing Polymers," J. Polymer Sci.: Symp. No. 45, 1–38 (1974).

Hawley's Condensed Chemical Dictionary, Eleventh Edition, revised by N.Irving Sax and R.J. Lewis, Sr., published by Van Nostrand Reinhold Co., New York, N.Y., (1987) at p. 1033.

Advanced Inorganic Chemistry A Comprehensive Text by F. A. Cotton and G. Wilkinson, F.R.S., Second revised and Augmented Ed., Interscience Publishers, London, England (1966) at p. 991.

Second College Edition, Websters New World Dictionary of the American Language, D.B. Guralnik, Prentice Hall Press, New York, N.Y. (1986) at p. 731.

*Primary Examiner*—Sam Silverberg

[57] ABSTRACT

Disclosed herein are processes for the electroless (chemical) plating of substrates incorporating polyelectrolytes to increase the catalytic site density prior to the electroless (chemical) metal deposition step.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–26 is confirmed.

New claims 27–30 are added and determined to be patentable.

27. *A process for the metallization of a substrate by electroless plating or chemical plating comprising:*
   a. *contacting said substrate with a composition comprising an adsorption modifier, said modifier being a polyelectrolyte, thereby providing a path for the increased catalytic site density,*
   b. *rinsing said substrate to remove excess adsorption modifier, and thereafter without the use of a sensitizing step*
   c. *contacting said treated substrate with a noble catalytic metal composition, said composition comprising a noble catalytic metal capable of electroless plating initiation, which directly or serving as a precursor leads to the catalytic sites which are capable of electroless plating initiation without said sensitizing step, and wherein said noble catalytic metal may be either in the elemental state, an alloy, a compound, or a soluble complex, and mixtures thereof, and*
   d. *contacting said substrate with a compatible electroless plating bath to deposit a metallic layer.*

28. *The process according to claim 27, wherein said catalytic metal is part of a colloidal product.*

29. *A process for the metallization of a printed circuitry substrate by electroless plating or chemical plating comprising:*
   a. *contacting said substrate with a composition comprising a polyelectrolyte, thereby providing a path for the increasing catalytic site density,*
   b. *rinsing said substrate to remove excess adsorption modifier, and thereafter without the use of a sensitizing step*
   c. *contacting said treated substrate with a noble catalytic metal composition, said composition comprising a noble metal capable of electroless plating initiation, which directly or serving as a precursor leads to the catalytic sites which are capable of electroless plating initiation without said sensitizing step, and wherein said noble catalytic metal may be either in the elemental state, an alloy, compound, or soluble complex, and mixtures thereof, and*
   d. *contacting said substrate with a compatible electroless plating bath to deposit a metallic layer.*

30. *The processes according to claim 29, wherein said catalytic metal is part of a colloidal product.*

* * * * *